United States Patent
Kang et al.

(10) Patent No.: US 7,911,847 B2
(45) Date of Patent: Mar. 22, 2011

(54) METHOD OF PROGRAMMING DATA IN A NAND FLASH MEMORY DEVICE AND METHOD OF READING DATA IN THE NAND FLASH MEMORY DEVICE

(75) Inventors: Hee-Soo Kang, Yongin-si (KR);
Choong-Ho Lee, Yongin-si (KR);
Dong-Uk Choi, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 154 days.

(21) Appl. No.: 12/289,847

(22) Filed: Nov. 5, 2008

(65) Prior Publication Data
US 2009/0190398 A1    Jul. 30, 2009

(30) Foreign Application Priority Data
Nov. 5, 2007    (KR) .................. 10-2007-0112215

(51) Int. Cl.
*G11C 16/04* (2006.01)
(52) U.S. Cl. ......... 365/185.18; 365/185.11; 365/185.17; 365/230.04; 365/230.09

(58) Field of Classification Search ............. 365/185.18, 365/185.11, 185.25, 185.17, 185.08, 230.04, 365/230.09
See application file for complete search history.

(56) References Cited

U.S. PATENT DOCUMENTS

| | | | |
|---|---|---|---|
| 5,966,326 A | 10/1999 | Park et al. | |
| 6,353,553 B1 | 3/2002 | Tamada et al. | |
| 6,751,124 B2 * | 6/2004 | Lee ..................... | 365/185.18 |
| 7,221,589 B2 * | 5/2007 | Li ....................... | 365/185.17 |
| 7,443,728 B2 * | 10/2008 | Lee et al. ............ | 365/185.17 |

FOREIGN PATENT DOCUMENTS

| | | |
|---|---|---|
| JP | 2001-210082 | 8/2001 |
| KR | 1999-0013057 A | 2/1999 |
| KR | 10-0205240 B1 | 4/1999 |

* cited by examiner

*Primary Examiner* — Pho M Luu
(74) *Attorney, Agent, or Firm* — Lee & Morse, P.C.

(57) ABSTRACT

A method of programming data in a NAND flash memory device including at least one even bitline and at least one odd bitline, the method including programming N-bit data into first cells coupled to the at least one even bitline or the at least one odd bitline and programming M-bit data into second cells coupled to the other of the at least one even bitline and the at least one odd bitline, where N is a natural number greater than one and M is a natural number greater than N.

20 Claims, 3 Drawing Sheets

FIG.2

| | B/Le<br>C0 | B/Lo<br>C1 | B/Le<br>C2 | B/Lo<br>C3 | B/Le<br>C4 | ... |
|---|---|---|---|---|---|---|
| W/L3 | ⋮ | ⋮ | ⋮ | ⋮ | ⋮ | ⋮ |
| W/L2 | C20<br>7(LSB) | C21<br>8(LSB) | C22<br>7(LSB) | C23<br>8(LSB) | C24<br>7(LSB) | ... |
| W/L1 | C10<br>9(MSB)<br>3(LSB) | C11<br>101(M'SB)<br>10(MSB)<br>4(LSB) | C12<br>9(MSB)<br>3(LSB) | C13<br>101(M'SB)<br>10(MSB)<br>4(LSB) | C14<br>9(MSB)<br>3(LSB) | ... |
| W/L0 | C00<br>5(MSB)<br>1(LSB) | C01<br>100(M'SB)<br>6(MSB)<br>2(LSB) | C02<br>5(MSB)<br>1(LSB) | C03<br>100(M'SB)<br>6(MSB)<br>2(LSB) | C04<br>5(MSB)<br>1(LSB) | ... |

FIG.3

| | B/Le<br>C0 | B/Lo<br>C1 | B/Le<br>C2 | B/Lo<br>C3 | ... |
|---|---|---|---|---|---|
| W/L3 | ⋮ | ⋮ | ⋮ | ⋮ | ⋮ |
| W/L2 | C20<br>11(MSB)<br>9(LSB) | C21<br>12(MSB)<br>10(LSB) | C22<br>11(MSB)<br>9(LSB) | C23<br>12(MSB)<br>10(LSB) | ... |
| W/L1 | C10<br>7(MSB)<br>5(LSB) | C11<br>101(M'SB)<br>8(MSB)<br>6(LSB) | C12<br>7(MSB)<br>5(LSB) | C13<br>101(M'SB)<br>8(MSB)<br>6(LSB) | C14<br>7(MSB)<br>5(LSB) |
| W/L0 | C00<br>3(MSB)<br>1(LSB) | C01<br>100(M'SB)<br>4(MSB)<br>2(LSB) | C02<br>3(MSB)<br>1(LSB) | C03<br>100(M'SB)<br>4(MSB)<br>2(LSB) | C04<br>3(MSB)<br>1(LSB) |

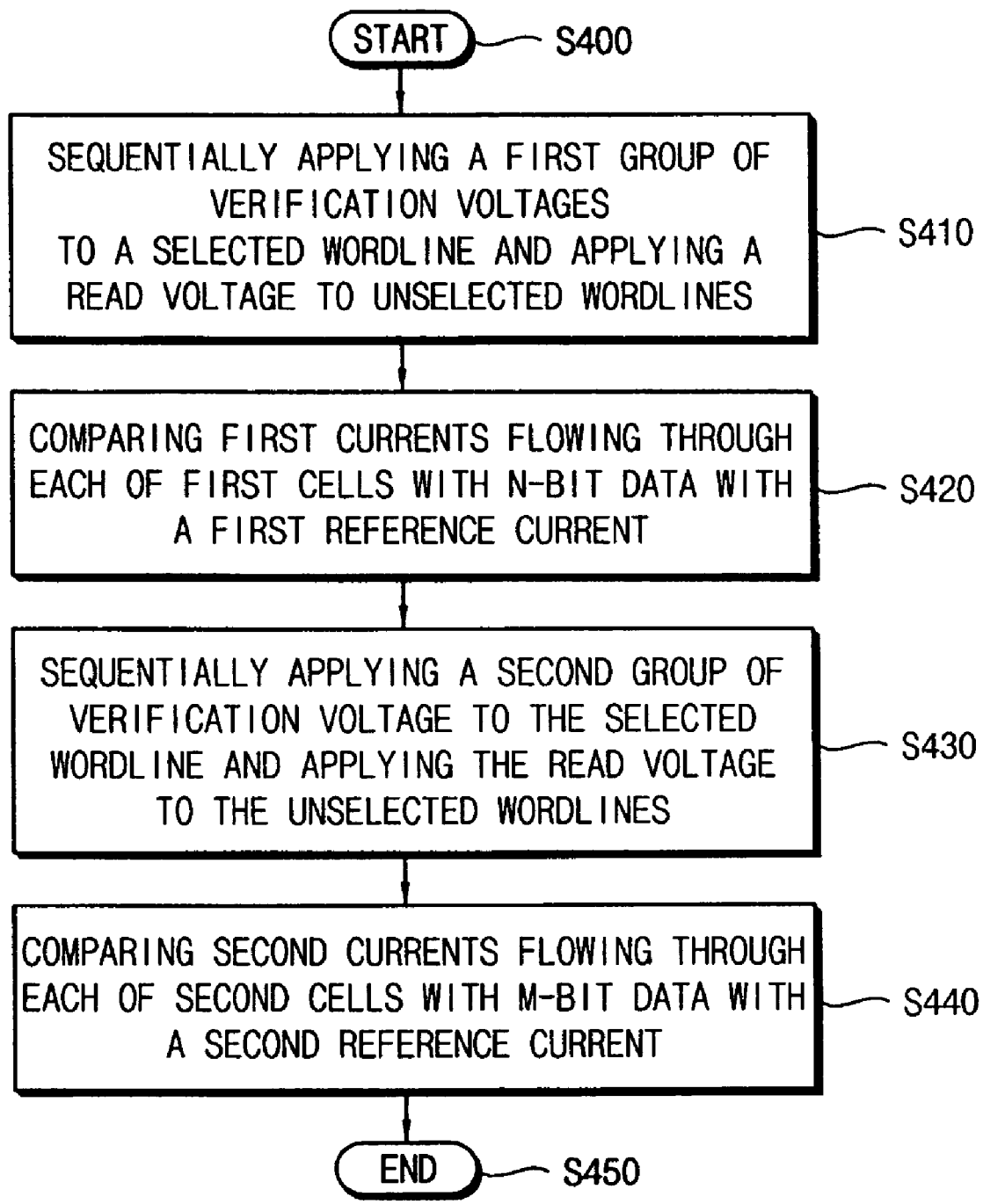

METHOD OF PROGRAMMING DATA IN A NAND FLASH MEMORY DEVICE AND METHOD OF READING DATA IN THE NAND FLASH MEMORY DEVICE

BACKGROUND

1. Technical Field

Exemplary embodiments relate to a method of programming data and/or a method of reading data in a flash memory device. More particularly, exemplary embodiments relate to a method of programming data and/or a method of reading data in a flash memory device adapted to store multi-bit data.

2. Description of the Related Art

A semiconductor memory device may be a storage device that stores data. The data may be read from the semiconductor memory device, if necessary. In each memory cell of the semiconductor device, the semiconductor memory device may store data as logic "0" or logic "1." Such semiconductor memory devices may be classified as a non-volatile memory device that maintains stored data when power is off or a volatile memory device that loses stored data when power is off.

Non-volatile memory devices may include, e.g., a flash memory device. The flash memory device is an electrically erasable and programmable read only memory (EEPROM), in which stored data may be electrically erased and new data may be reprogrammed. Generally, such data may be erased and programmed in large blocks. EEPROM may be used for a computer, a digital camera, an MP3 player, a game system, a memory stick, etc.

Flash memory devices may generally be classified according to a configuration of a memory cell array into, e.g., NAND flash memory devices, NOR flash memory devices, etc. In NAND flash memory devices, cell transistors may be coupled in parallel between a bitline and a ground electrode. In NOR flash memory devices, cell transistors may be serially coupled between a bitline and a ground electrode. A NAND flash memory device generally has higher programming and erasing speeds than a NOR flash memory device, but is not adapted to provide access per byte during reading and programming operations.

A cell array of the flash memory device includes a plurality of memory cells coupled to wordlines and bitlines. The wordlines may be driven by a column decoder and the bitlines may be driven by a page buffer. Each of the memory cells may store one-bit data, such as logic "0" or logic "1". A method of storing multi-bit data in a memory cell has been developed, which increases storage capacity without increasing a size of the memory device. The memory cell may have one of multiple states according to the stored multi-bit data. Such multi-state memory cells are generally referred to as a multi-level cell (MLC). For example, when two bits may be stored in a single MLC, the MLC has four states "11", "10", "01" and "00" according to a threshold voltage of a cell transistor. For example, when three bits are stored in a single MLC, the MLC has eight states "000", "100", "010", "110", "001", "101", "011" and "111" according to a threshold voltage of a cell transistor. That is, for storing three-bit data, a threshold voltage of each memory cell requires eight distinct distributions.

A NAND flash memory device having MLCs may have a narrower range of threshold voltage for discriminating data among the multiple states as compared to a NAND flash memory device having single level cells (SLCs). Thus, such NAND flash memory devices including MLCs may have a higher probability of data in a cell being changed, when a threshold voltage of the cell is slightly changed due to external noise and/or coupling interference with adjacent cells. Thus, in NAND flash memory devices including MLCs, it is highly important to program data into each cell while reducing external noise and interference.

In addition, when such NAND flash memory devices including MLCs are programmed, gaps of the threshold voltage distributions of each memory are generally very narrow. Thus, ideally, when a selected cell is programmed, a cell adjacent to the selected cell should not be influenced.

However, when a size of each memory cell of the NAND flash memory device having MLCs is reduced, interference between adjacent cells may increase. Thus, storing multi-bit data into each memory cell may be difficult. Improved methods for implementing NAND flash memory devices, and, more particularly, programming and/or reading data to/from such NAND flash memory devices including MLCs are required.

SUMMARY

Embodiments are therefore directed to a method of programming data in a NAND flash memory device and/or a method of reading data in the NAND flash memory device, which substantially overcome one or more of the problems due to limitations and disadvantages of the related art.

It is therefore a feature of an embodiment to provide a method of programming data in a NAND flash memory device, which is capable of programming a multi-bit data while reducing interference between adjacent cells.

It is therefore a feature of an embodiment to reduce and/or eliminate a coupling interference between adjacent cells when multi-bit data are programmed into cells of a NAND flash memory device.

It is therefore another feature of an embodiment to provide a method of reading data from cells of a NAND flash memory device.

It is therefore another feature of an embodiment to provide a method of reading data from cells of a NAND flash memory device in which data was programmed with multi-bit data according to a programming method adapted to reduce interference between adjacent cells.

At least one of the above and other features and advantages of the present invention may be realized by providing a method of programming data in a NAND flash memory device including at least one even bitline and at least one odd bitline, the method including programming N-bit data into first cells coupled to the at least one even bitline or the at least one odd bitline, N being a natural number greater than one, and programming M-bit data into second cells coupled to the other of the at least one even bitline and the at least one odd bitline, M being a natural number greater than N.

Programming N-bit data may include sequentially programming a first bit of the N-bit data and a second bit of the N-bit data into the respective first cells. Programming N-bit data may include simultaneously programming the first cells coupled to a same wordline of the NAND flash memory device with a respective bit of the respective N-bit data.

Programming M-bit data may include sequentially programming a first bit of the M-bit data, a second bit of the M-bit data and a third bit of the M-bit data into the respective second cells.

Programming M-bit data may include simultaneously programming the second cells coupled to a same wordline of the NAND flash memory device with a respective bit of the respective M-bit data.

The NAND flash memory device may include a plurality of wordlines, and, for each of the wordlines, programming N-bit data and programming M-bit data may include programming a respective bit of the N-bit data of each of the first cells of the respective wordline before programming a corresponding respective bit of the M-bit data of each of the second cells of the respective wordline.

For each of the wordlines, programming N-bit data and programming M-bit data may include programming first bits of the respective N-bit data of each of the first cells of the respective wordline before programming first bits of the respective M-bit data of each of the second cells of the respective wordline, and programming second bits of the respective N-bit data of each of the first cells of the respective wordline before programming second bits of the respective M-bit data of each of the second cells of the respective wordline, wherein for each of the first cells and the second cells, programming of the respective second bit occurs after programming of the respective first bit thereof.

Programming N-bit data and programming M-bit data may include programming second bits of the respective N-bit data of each of the first cells of a first of the plurality of wordlines and programming second bits of the respective M-bit data of each of the first cells of the first wordline after programming the first bits of the respective N-bit data of each of the first cells of the first wordline and at least a second of the plurality of the wordlines and the first bits of the respective M-bit data of each of the second cells of the first wordline and at least the second wordline, wherein the first wordline is currently selected and the first wordline is directly adjacent to the second wordline.

Programming N-bit data may include programming second bits of the respective N-bit data of each of the first cells of the second wordline after programming the second bits of the respective N-bit data of each of the first cells of the first wordline, and programming M-bit data further may include programming second bits of the respective M-bit data of each of the second cells of the second wordline after programming the second bits of the respective M-bit data of each of the second cells of the first wordline.

Programming N-bit data further may include programming the second bits of the respective N-bit data of each of first cells of the second wordline after programming the first bits of the respective N-bit data of each of the first cells of the first wordline, the second wordline and a third of the plurality of wordlines, the third wordline being directly adjacent to the second wordline, and programming M-bit data further may include programming the second bits of the respective M-bit data of each of the second cells of the second wordline after programming at least the first bits of the respective N-bit data of each of the first cells of the first wordline, the second wordline and the third wordline.

Programming M-bit data may further include programming at least one respective remaining (M-N) bit of the respective M-bit data of each of the second cells of a respective one of the wordlines after programming all the bits of the respective N-bit data of each of the first cells of the respective wordline.

Programming M-bit data may further include sequentially programming a respective last bit of the respective M-bit data of each of the second cells of each of the plurality of wordlines after programming all the bits of the respective N-bit data of each of the first cells of the respective wordline.

Programming N-bit data and programming M-bit data may include programming second bits of the respective N-bit data of each of the first cells of a first of the plurality of wordlines and programming second bits of the respective M-bit data of each of the second cells of the first wordline before programming first bits of the respective N-bit data of each of the first cells of a second of the plurality of the wordlines and the first bits of the respective M-bit data of each of the second cells of the second wordline, wherein the first wordline is currently selected and the first wordline is directly adjacent to the second wordline.

Programming N-bit data and programming M-bit data may include sequentially programming respective first to n bits of the N-bit data and the M-bit data into the first cells and the second cells of a first of the plurality of wordlines before programming respective first to n bits of the N-bit data and the M-bit data into the first cells and the second cells of a second of the plurality of wordlines.

Programming M-bit data may include programming at least one respective remaining (M-N) bit of the respective M-bit data of each of the second cells of a respective one of the wordlines after programming all the bits of the respective N-bit data of each of the first cells of the respective wordline.

Programming M-bit data may further include sequentially programming a respective last bit of the respective M-bit data of each of the second cells of each of the plurality of wordlines after programming all the bits of the respective N-bit data of each of the first cells of the respective wordline.

Programming N-bit data may include programming two-bit data into each of the first cells such that N is equal to two and programming M-bit data includes programming respective three-bit data into each of the second cells such that M is equal to three.

The NAND flash memory device may include a plurality of wordlines, and programming N-bit data and programming M-bit data may include programming N bits of the respective N-bit data and the respective M-bit data of each of the first cells and the second cells of at least a selected one and a directly adjacent one of the plurality of wordlines before programming at least one respective N-Mth bit of the second cells of the selected wordline.

At least one of the above and other features and advantages of the present invention may be separately realized by providing a method of reading data stored in a NAND flash memory device, the method including applying sequentially a first group of verification voltages to a selected wordline and a read voltage to unselected wordlines, reading respective N-bit data from first cells of the selected wordline by comparing respective first currents of the first cells with a first reference current, N being a natural number greater than one, and the first currents flowing through first cells coupled to at least one even bitline or at least one odd bitline, applying sequentially a second group of verification voltages to the selected wordline and the read voltage to unselected wordlines, and reading respective M-bit data from second cells of the selected wordline by comparing respective second currents of the second cells with a second reference current, M being a natural number greater than N, and the second currents flowing through second cells coupled to the other of the at least one even bitline and the at least one odd bitline.

Each of the first currents may have a magnitude according to states of the N-bit data, and each of the second currents may have a magnitude according to states of the M-bit data.

The first group of verification voltages may include at least three distinct verification voltages, and the second group of verification voltages may include at least seven distinct verification voltages.

BRIEF DESCRIPTION OF THE DRAWINGS

The above and other features and advantages of embodiments will become more apparent to those of ordinary skill in the art by describing in detail exemplary embodiments=with reference to the attached drawings, in which:

FIG. 2 illustrates a diagram of exemplary cells of a NAND flash memory device for describing an exemplary method of programming the cells of the NAND flash memory device according to an exemplary embodiment;

FIG. 3 illustrates a diagram of exemplary cells of a NAND flash memory device for describing another exemplary method of programming the cells of the NAND flash memory device according to an exemplary embodiment; and FIG. 4 illustrates a flow-chart of an exemplary method of reading data from cells of a NAND flash memory device according to an exemplary embodiment.

DETAILED DESCRIPTION OF EMBODIMENTS

Figure 1:
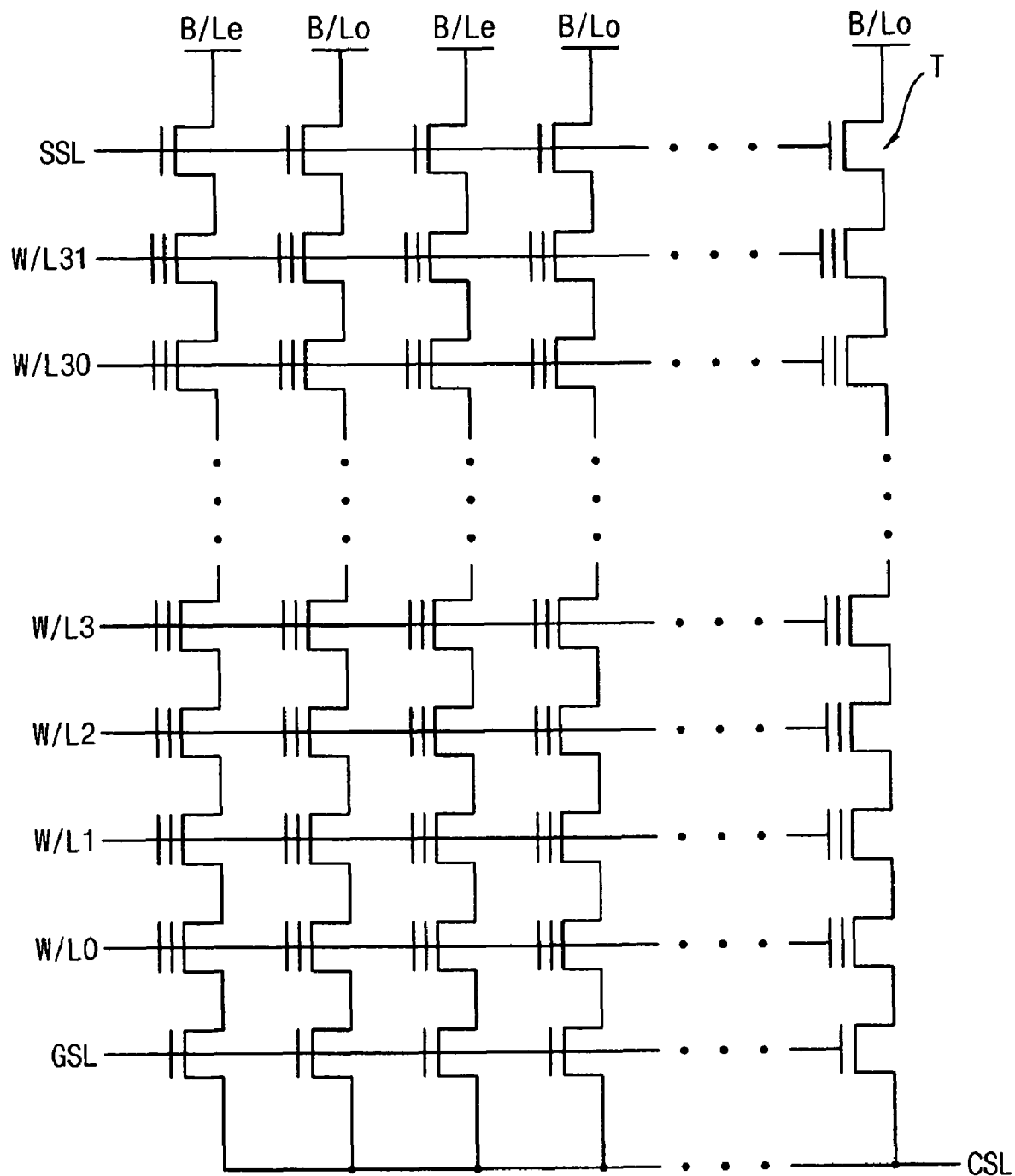
FIG. 1 illustrates a schematic diagram of an exemplary cell array of a NAND flash memory device.

Korean Patent Application No. 2007-0112215, filed on Nov. 5, 2007, in the Korean Intellectual Property Office, and entitled: "Method of Programming Data in a NAND Flash Memory Device and Method of Reading Data in the NAND Flash Memory Device," the contents of which are herein incorporated by reference in their entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the specification.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items. Unless specified otherwise, the term "simultaneously" includes substantially simultaneously, e.g., occurring during a same programming period.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments will be explained in detail with reference to the accompanying drawings.

FIG. 1 illustrates a schematic diagram of an exemplary embodiment of a cell array of a NAND flash memory device. FIG. 2 illustrates a diagram of exemplary cells of a NAND flash memory device for describing an exemplary method of programming the cells of the NAND flash memory device according to a first exemplary embodiment.

An exemplary method of programming data in a NAND flash memory device according to an exemplary embodiment will be described below with reference to FIGS. 1 and 2. In the following description, it will be assumed that two-bit data is programmed into cells, e.g., C00, C02, C04, C10, C12, etc., coupled to even bitlines B/Le, e.g., B/Le of even columns C0, C2, C4, etc., and three-bit data is programmed into cells, e.g., C01, C03, C11, C13, C21, C23, etc., coupled to odd bitlines B/Lo, e.g., B/Lo of odd columns C1, C3, C5, etc. Referring to FIG. 1, each transistor T of a respective memory cell may be coupled to a respective one of the bitlines B/Lo, B/Le via, e.g., a string selection line SSL. Each of the transistors T may be coupled to a column selection line CSL via, e.g., a ground selection line GSL.

Referring to FIGS. 1 and 3, in some embodiments of a data programming method according to one or more aspects of the invention, a first wordline WL0 may be selected. First bit data LSB may be respectively and simultaneously programmed into first cells, e.g., C00, C02, C04 . . . , coupled to the selected first word WL0 line and even bitlines BLe. The even bitlines B/Le, e.g., B/Le of even columns C0, C2, C4, etc., may include (N+1) even bitlines. When such programming is completed, respective first bit data LSB may be stored in each of the first cells C00, C02, C04 . . . coupled to the selected first wordline WL0 and even bitlines BLe (1(LSB) in FIG. 2).

Next, first bit data LSB may be simultaneously programmed into second cells C01, C03 . . . coupled to the selected first wordline WL0 and odd bitlines BLo. The odd bitlines B/Lo, e.g., B/Lo of odd columns C1, C3, etc., may include (N+1) odd bitlines. When such programming is completed, respective first bit data LSB may be stored in each of the second cells C01, C03 . . . coupled to the selected first wordline WL0 and even bitlines BLe (2(LSB) in FIG. 2).

In some embodiments, a second wordline WL1 may then be selected. First bit data LSB may be respectively and simultaneously programmed into first cells C10, C12, C14 . . . coupled to the selected second wordline WL1 and even bitlines BLe. When such programming is completed, respective first bit data LSB may be stored in each of the first cells C10, C12, C14 . . . coupled to the selected second wordline WL1 and even bitlines BLe (3(LSB) in FIG. 2).

Next, first bit data LSB may be simultaneously programmed into second cells C11, C13, . . . coupled to the selected second wordline WL1 and odd bitlines BLo, e.g., B/Lo of odd columns C1, C3, etc. When such programming is completed, respective first bit data LSB may be stored in each of the second cells C11, C13 . . . coupled to the selected second wordline WL1 and even bitlines BLe (4(LSB) in FIG. 2).

In some embodiments, the first wordline WL0 may again be selected. Second bit data MSB may be simultaneously programmed into the first cells C00, C02, C04 . . . coupled to the selected first wordline WL0 and even bitlines BLe, e.g., B/Le of even columns C0, C2, C4, etc. When such programming is completed, respective second bit data MSB may be stored in each of the first cells C00, C02, C04 . . . coupled to the first wordline WL0 and even bitlines BLe (5(MSB) in FIG. 2). In such embodiments, at such point, the first bit data LSB and the second bit data MSB may be stored in the first cells C00, C02, C04 . . . coupled to the first word WL0 line and even bitlines BLe.

In some embodiments, as described above, the first bit data LSB may be programmed into each of the first cells C10, C12, C14 . . . coupled to the second wordline WL1 and the even bitlines BLe, and/or into each of the second cells C11, C13 . . . coupled to the second wordline WL1 and the odd bitlines BLe, before the second bit data MSB is programmed into each of the first cells C00, C02, C04 . . . coupled to the first wordline WL1 and the even bitlines BLe. Therefore, no coupling interference may occur relative to the first cells C00, C02, C04 . . . coupled to the first wordline WL0 and even bitlines BLe when the first bit data LSB is programmed into first cells C10, C12, C14 . . . coupled to the second wordline WL1 and the even bitlines BLe and/or into the second cells C11, C13 . . . coupled to second wordline WL1 and the odd bitlines BLo.

Next, referring still to FIG. 2, second bit data MSB may be simultaneously programmed into each of the second cells C01, C03 . . . coupled to the first word WL0 line and odd bitlines BLo (6(MSB) in FIG. 2). When such programming is completed, the first bit data LSB and the second bit data MSB may be stored in the second cells C01, C03 . . . coupled to the first wordline WL0 and odd bitlines BLo.

When the second bit data MSB is programmed into each of the second cells C01, C03 . . . coupled to the first word WL0 line and odd bitlines BLo, a coupling interference may occur relative to the first cells C00, C02, C04 . . . coupled to the first wordline WL0 and the even bitlines BLe. However, a coupling interference due to programming the first cells C00, C02, C04 . . . coupled the even bitlines BLe may not occur relative to the second cells C01, C03 . . . coupled to the odd bitlines BLo, because, in some embodiments, the second cells C01, C03 . . . coupled to the odd bitlines BLo may be programmed after the first cells C00, C02, C04 . . . coupled the even bitlines BLe are programmed. In such embodiments, the first cells C00, C02, C04 . . . coupled to the even bitlines BLe may be relatively more influenced by a coupling interference than the second cells C01, C03 . . . coupled to the odd bitlines BLo.

Next, referring still to FIG. 2, a third wordline WL2 may be selected. As shown in FIG. 1, the third wordline WL2 may be directly adjacent to the second wordline WL1, which may be directly adjacent to the first wordline WL0. First bit data LSB may be simultaneously programmed into first cells C20, C22, C24 . . . coupled to the selected third wordline WL2 and even bitlines BLe (7(LSB) in FIG. 2).

First bit data LSB may then be simultaneously programmed into second cells C21, C23 . . . coupled to the selected third wordline WL2 and odd bitlines BLo (8(LSB) in FIG. 2).

Next, the second wordline WL1 may be selected again. Second bit data MSB may then be simultaneously programmed into the first cells C10, C12, C14 . . . coupled to the selected second word WL1 line and the even bitlines BLe (9(LSB) in FIG. 2). When such programming is completed, the first bit data LSB and the second bit data MSB may be stored in the first cells C10, C12, C14 . . . coupled to the second word WL1 line and the even bitlines BLe. In embodiments in which N is equal to two, at this point, programming the first cells C10, C12, C14 . . . coupled to the second word WL1 line and the even bitlines BLe may be complete.

Next, second bit data MSB may be simultaneously programmed into the second cells C11, C13 . . . coupled to the second word WL1 line and the odd bitlines BLo (10(LSB) in FIG. 2).

In such embodiments, when the second bit data MSB is programmed into the first cells C10, C12, C14 . . . and second cells C11, C13 . . . coupled to the second word WL1, a coupling interference may occur relative to the first cells C00, C02, C04 and the second cells C01, C03 coupled to the first wordline WL0.

As explained above, in some exemplary embodiments, respective first bit data LSB may be sequentially programmed into each of first cell(s) coupled to a selected k-th wordline and an even bitline(s) BLe, and into the each of the second cell(s) coupled the k-th wordline and an odd bitline(s) BLo. Then, first bit data LSB may be sequentially programmed into each of first cell(s) coupled to a (k+1)-th wordline and the even bitline(s) BLe, and into each of second cell(s) coupled the (k+1)-th wordline and the odd bitline(s) BLo. Then, second bit data MSB may be sequentially programmed into each of the first cell(s) coupled to the k-th wordline and the even bitline(s) BLe and into the each of the second cell(s) coupled the k-th wordline and the odd bitline(s) BLo.

That is, in some embodiments, before the second bit data MSB is programmed into each of the cell(s) coupled to a selected wordline and the even bitline(s) BLe and/or the odd bitline(s) BLo, the first bit data LSB is already programmed into some and/or all of the cells coupled to a next wordline, e.g., a wordline directly adjacent to the selected wordline. When data is programmed according to the above procedure, two-bit data may be stored in each of the cells while reducing coupling interference.

Third bit data M'SB may be programmed into each of the cells, coupled to the odd bitlines BLo, which are relatively less influenced by the coupling interference, e.g., the second cells.

More particularly, third bit data M'SB may be programmed into each of the second cells C01, C03 . . . coupled to the first wordline WL0 and odd bitlines BLe (100(MSB) in FIG. 2). Then, third bit data M'SB may be programmed into each of the second cells C11, C13 . . . coupled to the second wordline WL1 and odd bitlines BLe (101 (MSB) in FIG. 2). Thus, three-bit data may be stored in each of the second cells C01, C03 . . . and C11, C13 . . . as a result of programming the third bit data M'SB into each of the second cells C01, C03 . . . and C11, C13 . . . coupled to the odd bitlines BLo.

As explained above, three-bit data may be stored in each of the second cells, coupled to the odd bitlines BLo that may be relatively less influenced by the coupling interference, and two-bit data may be stored in each of the first cells, coupled to the even bitlines BLe that may be relatively more influenced by the coupling interference. Therefore, NAND flash memory devices programmed according to exemplary embodiments may increase storage capability by reducing operation failure that may result from coupling interference while storing more data.

In an exemplary embodiment explained above, it is taken for example that three-bit data is stored in each of the second cells, coupled to the odd bitlines BLo, which are relatively less influenced by the coupling interference, and two-bit data is stored in each of the first cells, coupled to the even bitlines BLe, which are relatively more influenced by the coupling interference. However, embodiments are not limited thereto. For example, a programming method may be used where one bit data is stored in cells coupled to the even bitlines BLe, which are relatively more influenced by the coupling interference, and two-bit data is stored in cells coupled to the odd bitlines BLo, which are relatively less influenced by the coupling interference. Further, e.g., there may be a difference of more than one bit between data stored in less influenced cells and relatively more influenced cells and/or the data of a larger number of bits maybe stored in the less influenced cells. According to the exemplary embodiment of FIG. 2, before another bit, e.g., a second bit, of the cells of a currently selected wordline is programmed, initial programming, e.g., programming of a first bit, of some and/or all of the cells of a next wordline, e.g., directly adjacent wordline, are programmed.

FIG. 3 illustrates a diagram of exemplary cells of a NAND flash memory device for describing another exemplary method of programming the cells of the NAND flash memory device according to a second exemplary embodiment.

A programming method with reference to FIG. 3 is different from a programming method with reference to FIGS. 1 and 2 in that each of the cells are programmed in a different order. In general, only differences between the exemplary method of FIG. 2 and the exemplary method of FIG. 3 will be described below.

In the exemplary embodiment of FIG. 3, respective N bits of N-bit data of first cells and M-bit data of second cells of a wordline are sequentially programmed before respective N-bits of N-bit data of first cells and M-bit data of second cells of a next wordline, e.g., a directly adjacent wordline to be subsequently programmed, are programmed, and remaining bit(s) of the M-bit data of the second cells are programmed thereafter, e.g., after all the N-bits of N-bit data of all the first cells and M-bit data of all the second cells in all the wordlines are programmed, or after all the N-bits of N-bit data and N-bits of M-bit data of at least the next wordline are programmed.

Referring to FIG. 3, a first wordline WL0 may be selected. First bit data LSB may be simultaneously programmed into first cells C00, C02, C04 . . . coupled to the selected first word WL0 line and even bitlines BLe (1(LSB) in FIG. 3). The even bitlines may include (N+1) even bitlines.

First bit data LSB may then be simultaneously programmed into second cells C01, C03 . . . coupled to the selected first wordline WL0 and odd bitlines BLo (2(LSB) in FIG. 3). The odd bitlines may include (N+1) odd bitlines.

Next, second bit data MSB may be simultaneously programmed into the first cells C00, C02, C04 . . . coupled to the first word WL0 line and even bitlines BLe (3(MSB) in FIG. 3).

Second bit data MSB may then be simultaneously programmed into each of the second cells C01, C03 . . . coupled to the first word WL0 line and odd bitlines BLo (4(MSB) in FIG. 3).

When such programming is completed, two bit data may be programmed into cells coupled to the first wordline WL0.

A second wordline WL1 may then be selected. First bit data LSB may be simultaneously programmed into first cells C10, C12, C14 . . . coupled to the selected second word WL1 line and even bitlines BLe (5(LSB) in FIG. 3).

First bit data LSB may be simultaneously programmed into second cells C11, C13 . . . coupled to the second wordline WL1 and odd bitlines BLo (6(LSB) in FIG. 3).

Next, second bit data MSB may be simultaneously programmed into the first cells C10, C12, C14 . . . coupled to the second word WL1 line and even bitlines BLe (7(MSB) in FIG. 3). Second bit data MSB may then be simultaneously programmed into each of the second cells C11, C13 . . . coupled to the second word WL1 line and odd bitlines BLo (8(MSB) in FIG. 3).

As explained above, for each of the wordlines WL0, WL1, etc., after sequentially programming first bit data into the first cells coupled to the selected wordline and the even bitlines, and into the second cells the selected wordline and the odd bitlines, second bit data may be sequentially programmed.

In the exemplary method described above, coupling interference may occur relative to the first cells C00, C02, C04 . . . coupled to the first wordline WL0 and the even bitlines BLe when the second bit data MSB is programmed into the each of the second cells C01, C03 . . . coupled to the first wordline WL0 and odd bitlines BLo, and when the first bit data LSB and the second bit data MSB is respectively programmed into the first cells C10, C12, C14 . . . coupled to the second word WL1 and the second cells C11, C13 . . . coupled to the second word WL1 line.

With regard to the second cells C01, C03 . . . , a coupling interference may occur relative to the second cells C01, C03 . . . coupled to the first word WL0 line and odd bitlines BLo when the first bit data LSB and the second bit data MSB is respectively programmed into the first cells C10, C12, C14 . . . coupled to the second word WL1 and the second cells C11, C13 . . . coupled to the second word WL1 line. However, a coupling interference may not occur relative to the second cells C01, C03 . . . coupled to the first word WL0 line and odd bitlines BLo during programming of the second bits data MSB into the first cells C00, C02 . . . coupled to the first wordline WL0 and even bitlines B/Le. That is, the second cells C01, C03 . . . coupled to the odd bitlines BLo may be relatively less influenced by a coupling interference than the first cells C00, C02 . . . coupled to the even bitlines BLe.

Third bit data M'SB may be programmed into each of the second cells, coupled to the odd bitlines BLo, which are relatively less influenced by the coupling interference.

More particularly, third bit data M'SB may be programmed into each of the second cells C01, C03 . . . coupled to the first wordline WL0 and odd bitlines BLe (100(MSB) in FIG. 3). Then, third bit data M'SB is programmed into each of the second cells C11, C13 . . . coupled to the second wordline WL1 and odd bitlines BLe (101(MSB) in FIG. 3). Thus, in such embodiments, the second cells C01, C03 . . . and C11, C13 . . . may store three-bit data by programming the third bit data M'SB into each of the second cells C01, C03 . . . and C11, C13 . . . coupled to the odd bitlines BLo.

As discussed above with regard to exemplary embodiments of FIGS. 2 and 3, in embodiments of the invention, data of a fewer number of bits, e.g., N, may be stored in cells of a memory device that are relatively more influenced by coupling interference and data of a larger (by 1 or more) number of bits, e.g., M, may be stored in cells of the memory device that are relatively less influenced by coupling interference, and, more particularly, e.g., the data of a fewer number of bits may be completely stored before the data of a larger number of bits is completely stored. For example, in some embodiments, e.g., a programming method where after data of a relatively fewer number of bits is completely stored in cells that are relatively more influenced by coupling interference, at least one bit of the data of a relative larger number of bits remains to be stored in cells that are relatively less influenced by coupling interference may be used. Further, in some embodiments, N bits of each of the data of a fewer number of bits N and N bits of the data of a relatively larger number of bits M may be stored in the respective cells before remaining number of bit(s) in excess of the N bits, i.e., remaining M-N bit(s), are stored in the respective cells that are relatively less influenced by coupling interference.

Further still, while two data sizes and two cell types, e.g., less influenced and more influenced, have been employed in the exemplary embodiments described herein, embodiments are not limited thereto. For example, in some embodiments, a programming method may be employed that results in more than two cell types, e.g., least influenced, relatively more influenced and most influenced, and, e.g., respective data to be stored in each of the different types of cells may be of different sizes such that data of a largest number of bits is stored in the least influenced cells, data of a medium number of bits is stored in the relatively more influenced cells and data of a least number of bits is stored in the most influenced cells.

FIG. 4 illustrates a flow-chart of an exemplary method of reading data from cells of a NAND flash memory device according to an exemplary embodiment.

Hereinafter, an exemplary method of reading data stored in cells of a flash memory device according to the above-mentioned programming method.

In a NAND flash memory device, for example a NAND flash memory device of FIGS. 1 through 3, each of first cells such as C00, C02, C04 . . . coupled to the even bitlines BLe may include two-bit data stored therein, and each of second cells such as C01, C03 . . . coupled to the odd bitlines BLo may include three-bit data stored therein.

Referring to FIG. 4, at S400, a reading process may begin. At S410, a first group of verification voltages including first through third verification voltages may be sequentially applied to a selected wordline, e.g., the first wordline WL0, and a read voltage may be applied to unselected wordlines, e.g., the second through thirty-second wordlines WL1 through WL31. At S420, each of first currents flowing through each of the first cells such as C00, C02, C04 . . . according to the first group of verification voltages may be compared with a first reference current, and two-bit data stored in each of the first cells such as C00, C02, C04 . . . coupled to the even bitlines BLe may be read based on a comparison result.

At S430, a second group of verification voltages including first through seventh verification voltages may be sequentially applied to the selected wordline, e.g., the first wordline WL0, and a read voltage may be applied to unselected wordlines, e.g., the second through thirty-second wordlines WL1 through WL31. At S440, each of second currents flowing through each of the second cells such as C01, C03 . . . according to the second group of verification voltages may be compared with a second reference current, and three-bit data stored in each of the second cells such as C01, C03 . . . , coupled to the odd bitlines BLo may be read based on a comparison result. Reading may be completed at S450.

Hereinafter, a general explanation about an exemplary NAND flash memory device to which programming methods according to embodiments of the invention may be applied.

In general, a NAND flash memory device may include a memory cell array having a plurality of memory cells. More particularly, the memory cell array may include a plurality of first memory cells coupled to even bitlines, and a plurality of second memory cells coupled to odd bitlines. Each of the first memory cells may store N-bit data. Here, N may be a natural number greater than one. Each of the second memory cells may store M-bit data. Here, M may be a natural number greater than N. The first memory cells and the second memory cells may have same configurations. That is, the first memory cells and the second memory cells may include a tunnel oxide layer pattern, a charge storage layer pattern, a blocking dielectric layer pattern, and a control gate electrode pattern, which may be layered together. The blocking dielectric layer pattern may include, e.g., silicon oxide (O), silicon nitride (N) and/or silicon oxide (O) layer(s). For example, the blocking dielectric layer may include an ONO configuration. In addition, the blocking dielectric layer may include a metal oxide having a high dielectric constant.

The NAND flash memory device may include a first main register adapted to store data that will be programmed into the first memory cells, and a second main register adapted to store data that will be programmed into the second memory cells.

The NAND flash memory device may include a cache register adapted to store externally supplied data, and a dump circuit adapted to transfer the data stored in the cache register.

The foregoing is illustrative of embodiments of the present invention and is not to be construed as limiting thereof. Although a few exemplary embodiments have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims.

What is claimed is:

1. A method of programming data in a NAND flash memory device including at least one even bitline and at least one odd bitline, the method comprising:
    programming N-bit data into first cells coupled to the at least one even bitline or the at least one odd bitline, N being a natural number greater than one; and
    programming M-bit data into second cells coupled to the other of the at least one even bitline and the at least one odd bitline, M being a natural number greater than N.

2. The method as claimed in claim 1, wherein programming N-bit data includes sequentially programming a first bit of the N-bit data and a second bit of the N-bit data into the respective first cells.

3. The method as claimed in claim 2, wherein programming N-bit data includes simultaneously programming the first cells coupled to a same wordline of the NAND flash memory device with a respective bit of the respective N-bit data.

4. The method as claimed in claim 1, wherein programming M-bit data includes sequentially programming a first bit of the M-bit data, a second bit of the M-bit data and a third bit of the M-bit data into the respective second cells.

5. The method as claimed in claim 4, wherein programming M-bit data includes simultaneously programming the second cells coupled to a same wordline of the NAND flash memory device with a respective bit of the respective M-bit data.

6. The method as claimed in claim 1, wherein the NAND flash memory device includes a plurality of wordlines, and, for each of the wordlines, programming N-bit data and programming M-bit data includes:
    programming a respective bit of the N-bit data of each of the first cells of the respective wordline before programming a corresponding respective bit of the M-bit data of each of the second cells of the respective wordline.

7. The method as claimed in claim 6, wherein, for each of the wordlines, programming N-bit data and programming M-bit data includes:
    programming first bits of the respective N-bit data of each of the first cells of the respective wordline before programming first bits of the respective M-bit data of each of the second cells of the respective wordline, and
    programming second bits of the respective N-bit data of each of the first cells of the respective wordline before programming second bits of the respective M-bit data of each of the second cells of the respective wordline, wherein for each of the first cells and the second cells, programming of the respective second bit occurs after programming of the respective first bit thereof.

8. The method as claimed in claim 7, wherein programming N-bit data and programming M-bit data includes programming second bits of the respective N-bit data of each of the first cells of a first of the plurality of wordlines and programming second bits of the respective M-bit data of each of the first cells of the first wordline after programming the first bits of the respective N-bit data of each of the first cells of the first wordline and at least a second of the plurality of the wordlines and the first bits of the respective M-bit data of each of the second cells of the first wordline and at least the second wordline, wherein the first wordline is currently selected and the first wordline is directly adjacent to the second wordline.

9. The method as claimed in claim 8, wherein:
programming N-bit data further includes programming second bits of the respective N-bit data of each of the first cells of the second wordline after programming the second bits of the respective N-bit data of each of the first cells of the first wordline, and
programming M-bit data further includes programming second bits of the respective M-bit data of each of the second cells of the second wordline after programming the second bits of the respective M-bit data of each of the second cells of the first wordline.

10. The method as claimed in claim 8, wherein:
programming N-bit data further includes programming the second bits of the respective N-bit data of each of first cells of the second wordline after programming the first bits of the respective N-bit data of each of the first cells of the first wordline, the second wordline and a third of the plurality of wordlines, the third wordline being directly adjacent to the second wordline, and
programming M-bit data further includes programming the second bits of the respective M-bit data of each of the second cells of the second wordline after programming at least the first bits of the respective N-bit data of each of the first cells of the first wordline, the second wordline and the third wordline.

11. The method as claimed in claim 10, wherein programming M-bit data further includes programming at least one respective remaining (M-N) bit of the respective M-bit data of each of the second cells of a respective one of the wordlines after programming all the bits of the respective N-bit data of each of the first cells of the respective wordline.

12. The method as claimed in claim 11, wherein programming M-bit data further includes sequentially programming a respective last bit of the respective M-bit data of each of the second cells of each of the plurality of wordlines after programming all the bits of the respective N-bit data of each of the first cells of the respective wordline.

13. The method as claimed in claim 7, wherein programming N-bit data and programming M-bit data includes programming second bits of the respective N-bit data of each of the first cells of a first of the plurality of wordlines and programming second bits of the respective M-bit data of each of the second cells of the first wordline before programming first bits of the respective N-bit data of each of the first cells of a second of the plurality of the wordlines and the first bits of the respective M-bit data of each of the second cells of the second wordline, wherein the first wordline is currently selected and the first wordline is directly adjacent to the second wordline.

14. The method as claimed in claim 13, wherein programming N-bit data and programming M-bit data includes sequentially programming respective first to n bits of the N-bit data and the M-bit data into the first cells and the second cells of a first of the plurality of wordlines before programming respective first to n bits of the N-bit data and the M-bit data into the first cells and the second cells of a second of the plurality of wordlines.

15. The method as claimed in claim 14, wherein programming M-bit data further includes programming at least one respective remaining (M-N) bit of the respective M-bit data of each of the second cells of a respective one of the wordlines after programming all the bits of the respective N-bit data of each of the first cells of the respective wordline.

16. The method as claimed in claim 15, wherein programming M-bit data further includes sequentially programming a respective last bit of the respective M-bit data of each of the second cells of each of the plurality of wordlines after programming all the bits of the respective N-bit data of each of the first cells of the respective wordline.

17. The method as claimed in claim 1, wherein programming N-bit data includes programming two-bit data into each of the first cells such that N is equal to two and programming M-bit data includes programming respective three-bit data into each of the second cells such that M is equal to three.

18. The method as claimed in claim 1, wherein the NAND flash memory device includes a plurality of wordlines, and programming N-bit data and programming M-bit data includes programming N bits of the respective N-bit data and the respective M-bit data of each of the first cells and the second cells of at least a selected one and a directly adjacent one of the plurality of wordlines before programming at least one respective N-Mth bit of the second cells of the selected wordline.

19. A method of reading data stored in a NAND flash memory device, the method comprising:
applying sequentially a first group of verification voltages to a selected wordline and a read voltage to unselected wordlines;
reading respective N-bit data from first cells of the selected wordline by comparing respective first currents of the first cells with a first reference current, N being a natural number greater than one, and the first currents flowing through first cells coupled to at least one even bitline or at least one odd bitline;
applying sequentially a second group of verification voltages to the selected wordline and the read voltage to unselected wordlines; and
reading respective M-bit data from second cells of the selected wordline by comparing respective second currents of the second cells with a second reference current, M being a natural number greater than N, and the second currents flowing through second cells coupled to the other of the at least one even bitline and the at least one odd bitline.

20. The method as claimed in claim 19, wherein:
each of the first currents has a magnitude according to states of the N-bit data,
each of the second currents has a magnitude according to states of the M-bit data, the first group of verification voltages includes at least three distinct verification voltages, and
the second group of verification voltages includes at least seven distinct verification voltages.

* * * * *